United States Patent
Yamamoto et al.

(10) Patent No.: US 8,558,245 B2
(45) Date of Patent: Oct. 15, 2013

(54) OPTICAL SEMICONDUCTOR DEVICE HAVING RIDGE STRUCTURE FORMED ON ACTIVE LAYER CONTAINING P-TYPE REGION AND ITS MANUFACTURE METHOD

(75) Inventors: Tsuyoshi Yamamoto, Kawasaki (JP); Hisao Sudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1114 days.

(21) Appl. No.: 11/655,229

(22) Filed: Jan. 19, 2007

(65) Prior Publication Data

US 2008/0073716 A1 Mar. 27, 2008

(30) Foreign Application Priority Data

Sep. 27, 2006 (JP) ................... 2006-263074

(51) Int. Cl.
*H01L 27/15* (2006.01)

(52) U.S. Cl.
USPC .................. 257/79; 257/E31.127; 372/43.01; 372/44.01

(58) Field of Classification Search
USPC .............. 257/E31.127, 79; 372/43.01, 44.01
See application file for complete search history.

(56) References Cited

U.S. PATENT DOCUMENTS

| | | | |
|---|---|---|---|
| 5,092,957 A * | 3/1992 | Ashby et al. ............. | 438/478 |
| 5,309,468 A | 5/1994 | Makiuchi | |
| 6,154,476 A | 11/2000 | Nishiguchi et al. | |
| 6,278,720 B1 * | 8/2001 | Lee et al. ................. | 372/46.01 |
| 2002/0037022 A1 * | 3/2002 | Fukagai ..................... | 372/46 |
| 2003/0165314 A1 * | 9/2003 | Nagarajan et al. ......... | 385/131 |

FOREIGN PATENT DOCUMENTS

| | | |
|---|---|---|
| JP | 5-55703 A | 3/1993 |
| JP | 6-177484 A | 6/1994 |
| JP | 11-145547 A | 5/1999 |
| JP | 2000-124548 | 4/2000 |
| JP | 2006286902 | * 10/2006 |

OTHER PUBLICATIONS

T. Yamabana, et al.; "Temperature independent transmission for 10 Gbps 300m-MMF using low driving-current quantum dot laser;" OFC/NFOEC2006 OFL3; 2 Sheets./Discussed in the specification.

"Japanese Office Action" mailed by JPO and corresponding to Japanese application No. 2006-263074 on May 31, 2011, with English translation.

* cited by examiner

*Primary Examiner* — Matthew Reames
(74) *Attorney, Agent, or Firm* — Fujitsu Patent Center (57) ABSTRACT

A p-type cladding layer (3) of p-type semiconductor is formed over a substrate. An active layer (5) including a p-type semiconductor region is disposed over the p-type cladding layer. A buffer layer (10) of non-doped semiconductor is disposed over the active layer. A ridge-shaped n-type cladding layer (11) of n-type semiconductor is disposed over a partial surface of the buffer layer. The buffer layer on both sides of the ridge-shaped n-type cladding layer is thinner than the buffer layer just under the ridge-shaped n-type cladding layer.

9 Claims, 7 Drawing Sheets

OPTICAL SEMICONDUCTOR DEVICE HAVING RIDGE STRUCTURE FORMED ON ACTIVE LAYER CONTAINING P-TYPE REGION AND ITS MANUFACTURE METHOD

CROSS REFERENCE TO RELATED APPLICATION

This application is based on and claims priority of Japanese Patent Application No. 2006-263074 filed on Sep. 27, 2006, the entire contents of which are incorporated herein by reference.

BACKGROUND OF THE INVENTION

A) Field of the Invention

The present invention relates to an optical semiconductor device having a ridge type waveguide with an active layer containing a p-type region being formed on a p-type cladding layer, the optical semiconductor device being applied to a semiconductor laser diode, an optical amplifier, an optical gate switch and the like for optical fiber communications.

B) Description of the Related Art

Presently, a quantum well structure is mainly adopted for an active layer of a semiconductor laser diode used as a light source of optical communications. Improving performance of a semiconductor laser device by adopting a quantum dot structure to an active layer has recently been researched. As the quantum dot structure is adopted for an active layer, a temperature dependence of laser characteristics can be mitigated considerably.

Description will be made on a semiconductor laser diode disclosed in the study by T. Yamabana et al, "Temperature independent transmission for 10 Gbps 300 m-MMF using low driving-current quantum dot laser", OFC/NFOEC 2006 OFL3. An active layer, which includes barrier layers and quantum dot layers stacked alternately, and a p-type AlGaAs cladding layer are formed on an n-type AlGaAs cladding layer. The barrier layer constituting the active layer is made of GaAs partially doped with p-type dopant. In the following, the active layer of this type is called a "p-type active layer". Current-light output characteristics of this semiconductor laser diode are least dependent upon temperature near a room temperature. Under the condition in which the drive conditions are fixed, high speed operation about 10 Gbps and multi mode fiber (MMF) transmission are realized in a temperature range between 20° C. and 80° C.

Figure 4A:
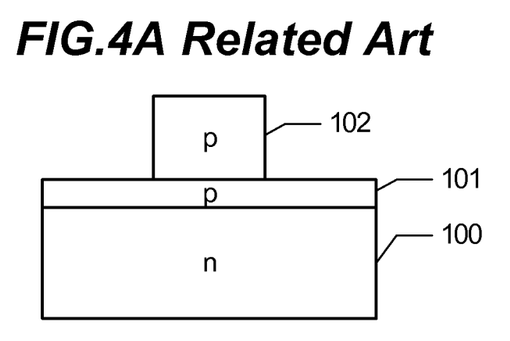
FIG. 4A is a schematic diagram showing a conventional ridge type optical semiconductor device.

FIG. 4A is a schematic diagram of a ridge-type semiconductor laser diode adopting a p-type active layer using an n-type substrate. A p-type active layer 101 is formed on the whole surface of an n-type substrate 100, and a ridge-shaped p-type cladding layer 102 is formed on a partial surface of the p-type active layer. This laser diode has a large capacitance because the interface between the n-type substrate 100 and p-type active layer 101 extends over the whole device area. Therefore, this laser diode is difficult to operate at high speed like 10 Gbps.

Figure 4B:
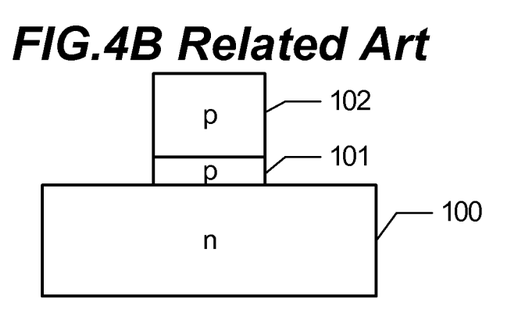
FIG. 4B is a schematic diagram showing a conventional high mesa type optical semiconductor device.

FIG. 4B is a schematic diagram showing a semiconductor laser diode disclosed in the above-cited document. In this example, a p-type active layer 101 is also patterned as a p-type cladding layer 102, and constitutes a portion of the ridge. This structure is called a "high mesa structure". As the high mesa structure is adopted, an increase in device capacitance can be prevented because the pn junction does not extend over the whole device area and is restricted only in the ridge portion. However, with the high mesa structure, the active layer 101 itself is etched and damages during etching are left in the active layer 101. It is therefore difficult to retain reliability sufficient for practical use.

SUMMARY OF THE INVENTION

A ridge type semiconductor laser diode having a p-type active layer formed on a p-type substrate has been researched to prevent an increase in device capacitance without adopting a high mesa structure (e.g., refer to Japanese Patent Application No. 2005-104448).

Figure 5A:
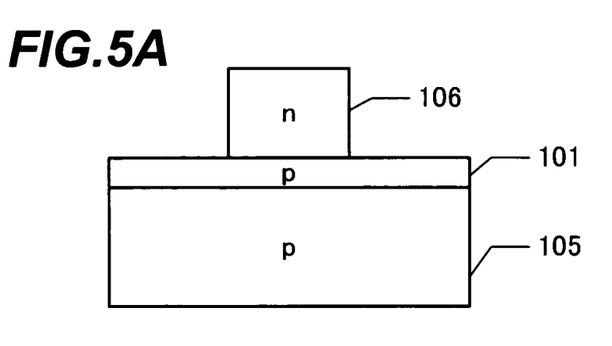
FIG. 5A is a schematic diagram showing a ridge type optical semiconductor device using a p-type substrate.

FIG. 5A is a schematic diagram showing a semiconductor laser diode using a p-type substrate. A p-type active layer 101 is formed on the whole surface of a p-type substrate 105, and a ridge-shaped n-type cladding layer 106 is formed on a partial surface of the p-type active layer. With this structure, an increase in device capacitance can be prevented because the pn junction is restricted only in a ridge portion.

Figure 5B:
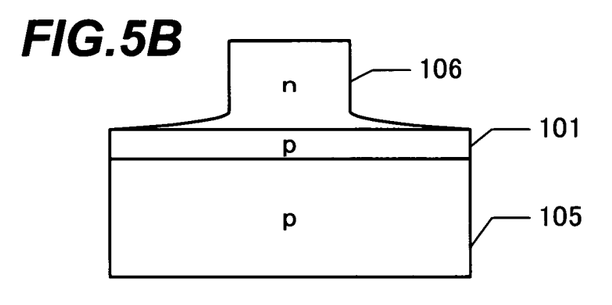
FIGS. 5B and 5C are schematic diagrams showing cross sectional shapes of ridges actually formed.
Figure 5C:
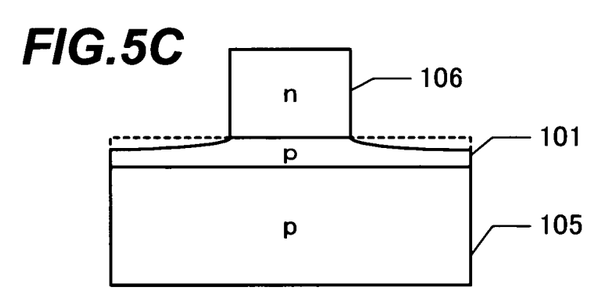

In a manufacture method for the semiconductor laser diode having the structure shown in FIG. 5A, during a process of patterning the n-type cladding layer 106 into a ridge shape, a portion of the n-type cladding layer formed on the whole surface is etched, and this etching is required to be stopped on the surface of the p-type active layer 101. However, as shown in FIGS. 5B and 5C, the bottoms of recesses formed on both sides of the ridge are not flat, but have a skirt shape from the sides of the ridge. This skirt shape appears in any one of wet etching and dry etching.

As shown in FIG. 5B, in the case in which the p-type active layer 101 is not etched at all even in the deepest etching area, for example, in which etching is stopped when the upper surface of the p-type active layer 101 is exposed in the deepest etching area, portions of the n-type cladding layer 106 are left near the sides of the ridge. As the portions of the n-type cladding layer 101 are left, an area of the pn junction becomes broad and the device capacitance reduction effects cannot be expected.

As shown in FIG. 5C, in the case in which the n-type cladding layer 106 is not left at all near the sides of the ridge, the surface layer of the p-type active layer 101 is etched in the region apart from the ridge. Damages are therefore left in the p-type active layer 101.

If the ridge shape is formed only by the control of an etching amount in this way, it is difficult not to leave damages in the p-type active layer 101 and to reduce device capacitance. If an etching stopper layer is disposed between the p-type active layer 101 and n-type cladding layer 106, an ideal shape shown in FIG. 5A can be formed. For example, JP-A-2003-273464 discloses techniques of flattening the surfaces near the sides of a ridge by disposing an n-type AlInAs etching stopper layer between an AlGaInAs multi quantum well active layer and an n-type InP cladding layer. However, proper material of the etching stopper layer cannot be selected in some cases depending upon materials of the active layer and cladding layer. For example, in the case of the layer structure of GaAs/AlGaAs mainly used by a quantum dot laser device in a wavelength band of 1.3 μm, it is difficult to introduce a proper etching stopper layer. Furthermore, since the etching stopper layer is made of material different from the materials of the upper and lower layers, a hetero junction is formed so that device resistance increases.

Figure 5D:
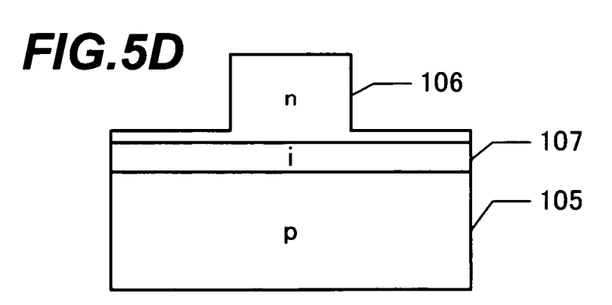
FIG. 5D is a schematic diagram showing a ridge type optical semiconductor device having a non-doped active layer.

FIG. 5D shows a semiconductor laser diode having a non-doped active layer 107 formed on a p-type substrate and an n-type cladding layer 106 formed on the active layer 107. An upper layer portion of the n-type cladding layer 106 is patterned in a ridge shape, and a lower layer portion covers the whole surface of the substrate. Since the active layer 107 is not doped, a pn junction is not formed. Accordingly, a degree of an increase in device capacitance is low even if the lower layer portion of the n-type cladding layer 106 covers the whole surface of the substrate. However, since the lower layer portion of the n-type cladding layer 106 covers the whole surface, there is some fear of current propagation from the ridge portion in a lateral direction. JP-A-HEI-5-291703 and JP-A-HEI-11-145547 describe researches on limitations of a composition, thickness, doping concentration and the like of the n-type cladding layer 106 from the viewpoint of suppressing current propagation in a lateral direction. However, if the non-doped active layer 107 is replaced with a p-type active layer, the pn junction interface broadens over the whole device surface and device capacitance increases. The structure shown in FIG. 5D is therefore not suitable for a semiconductor laser device adopting a p-type active layer.

An object of the present invention is to provide an optical semiconductor device and its manufacture method capable of preventing damages from being caused in a p-type active layer and suppressing an increase in device capacitance.

According to one aspect of the present invention, there is provided an optical semiconductor device comprising:

a p-type cladding layer of p-type semiconductor formed over a substrate;

an active layer including a p-type semiconductor region and disposed over the p-type cladding layer;

a buffer layer of non-doped semiconductor disposed over the active layer; and a ridge-shaped n-type cladding layer of n-type semiconductor disposed over a partial surface of the buffer layer, wherein the buffer layer on both sides of the ridge-shaped n-type cladding layer is thinner than the buffer layer just under the ridge-shaped n-type cladding layer.

According to another aspect of the present invention, there is provided a method of manufacturing an optical semiconductor device comprising steps of:

(a) forming a p-type cladding layer of p-type semiconductor over a substrate;

(b) forming an active layer including a p-type semiconductor region over the p-type cladding layer;

(c) forming a buffer layer of non-doped semiconductor over the active layer;

(d) forming an n-type cladding layer of n-type semiconductor over the buffer layer;

(e) covering a partial surface of the n-type cladding layer with a mask pattern and etching the n-type cladding layer and the buffer layer to a depth reaching a bottom of the n-type cladding layer and not reaching a bottom of the buffer layer to form the n-type cladding layer in a ridge shape; and (f) removing the mask pattern.

The non-doped buffer layer is disposed between the active layer and n-type cladding layer, and a skirt portion left on both sides of the ridge is made of the non-doped buffer layer. A pn junction is restricted only in the ridge portion without extending to the whole device area so that an increase in device capacitance can be suppressed. Further, since the buffer layer is left on the active layer during etching for forming the ridge, the active layer is not damaged by etching.

DESCRIPTION OF THE PREFERRED EMBODIMENTS

Figure 1A:
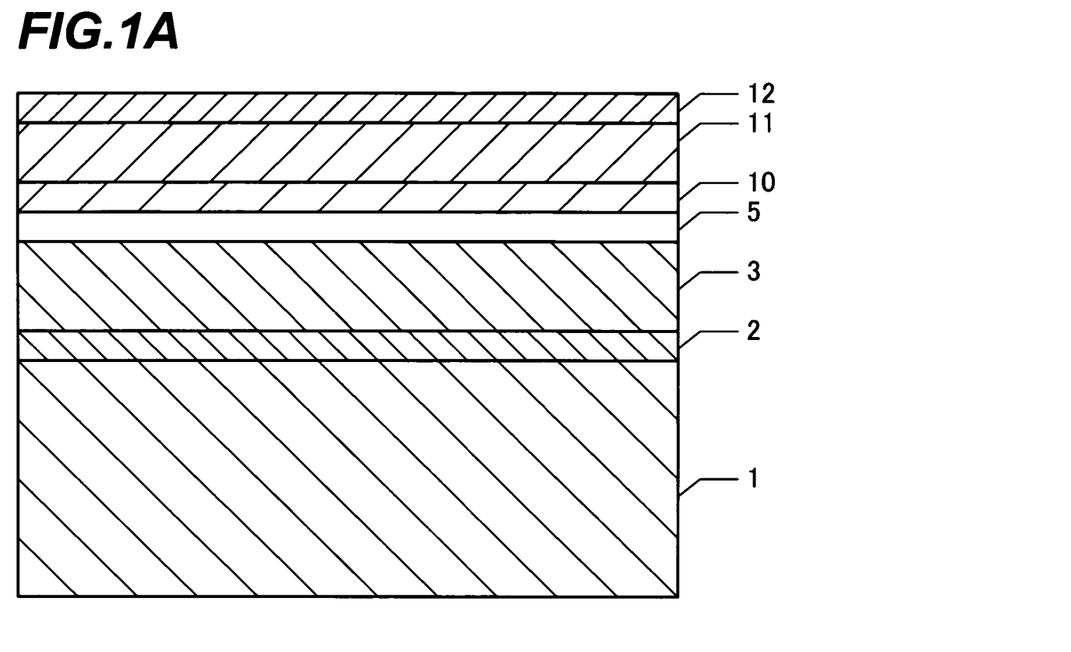
FIGS. 1A to 1E are cross sectional views of an optical semiconductor device during manufacture according to a first embodiment.

With reference to FIGS. 1A to 1F, description will be made on a manufacture method for an optical semiconductor device according to the first embodiment.

a p-type buffer layer 2 of p-type GaAs having a thickness of 0.5 μm, a p-type cladding layer 3 of p-type $Al_{0.4}Ga_{0.6}As$ having a thickness of 1.5 μm, an active layer 5, a buffer layer 10 of non-doped GaAs having a thickness of 50 nm, an n-type cladding layer 11 of n-type $Al_{0.4}Ga_{0.6}As$ having a thickness of 1 μm, and an n-type contact layer 12 of n-type GaAs having a thickness of 0.3 μm are sequentially formed on a p-type GaAs substrate 1, for example, by molecular beam epitaxy (MBE).

Figure 1B:
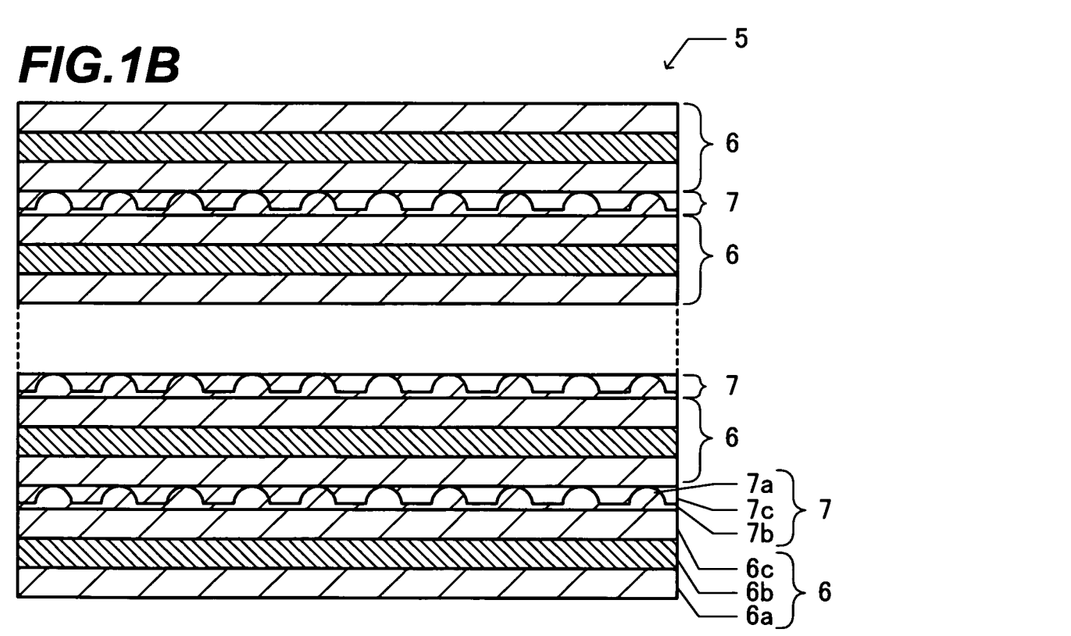

FIG. 1B is a detailed cross sectional view of the active layer 5. The active layer 5 has a lamination structure, which is formed by stacking ten pairs of a barrier layer 6 and a quantum dot layer 7 and then forming a barrier layer 6 on the uppermost quantum dot layer 7.

The quantum dot layer 7 is constituted of a number of InAs quantum dots 7a distributed in-plane, a wetting layer 7b thinly covering an underlying surface, and an InGaAs strain relaxing layer 7c covering the quantum dots 7a and wetting layer 7b. The quantum dot layer 7 is formed using, for example, a growth mode called a Stranski-Krastanow (SK) mode to obtain a density of the quantum dots 7a of about $4 \times 10^{10}$ cm$^{-2}$ and a photoluminescence emission wavelength of about 1.31 μm. A thickness of each quantum dot layer 7 is several nm, e.g., about 5 nm.

The quantum dot layer 7 may be formed using liquid droplet epitaxy, a Volumer-Weber type growth mode or the like, in addition to the SK mode. The quantum dot layer may also be formed by micro patterning technologies with patterning and etching.

The barrier layer 6 has a three-layer structure of a non-doped GaAs layer 6a, a p-type GaAs layer 6b and a non-doped GaAs layer 6c stacked in this order. A dopant concentration of the p-type GaAs layer 6b is, for example, $5 \times 10^{17}$ cm$^{-3}$. A thickness of each barrier layer 6 is 35 nm, and each p-type GaAs layer 6b is disposed generally at the center in a thickness direction and has a thickness of 10 nm. Each barrier layer 6 may be a single layer of p-type GaAs or a two-layer structure of a p-type GaAs layer and a non-doped GaAs layer.

Figure 1C:
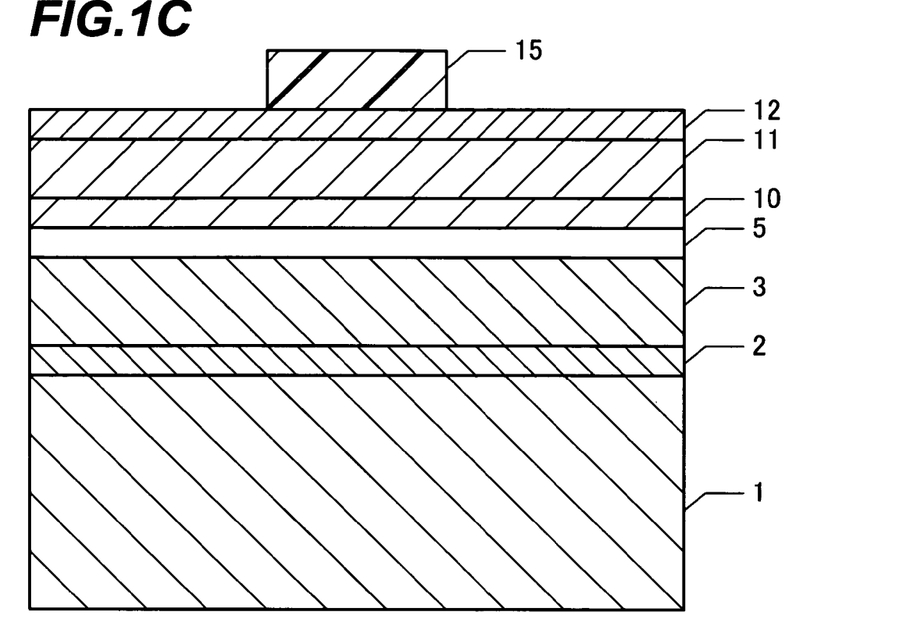

As shown in FIG. 1C, a resist pattern 15 like a linear shape is formed on the n-type contact layer 12 by conventional photolithography techniques. If the finished ridge width is, for example, 2 μm and wet etching is used, a width of the resist pattern 15 is set to 4 μm because side etching occurs. If dry etching is used, a width of the resist pattern is set to the same as a finished ridge width, e.g., 2 μm, because side etching hardly occurs.

Figure 1D:
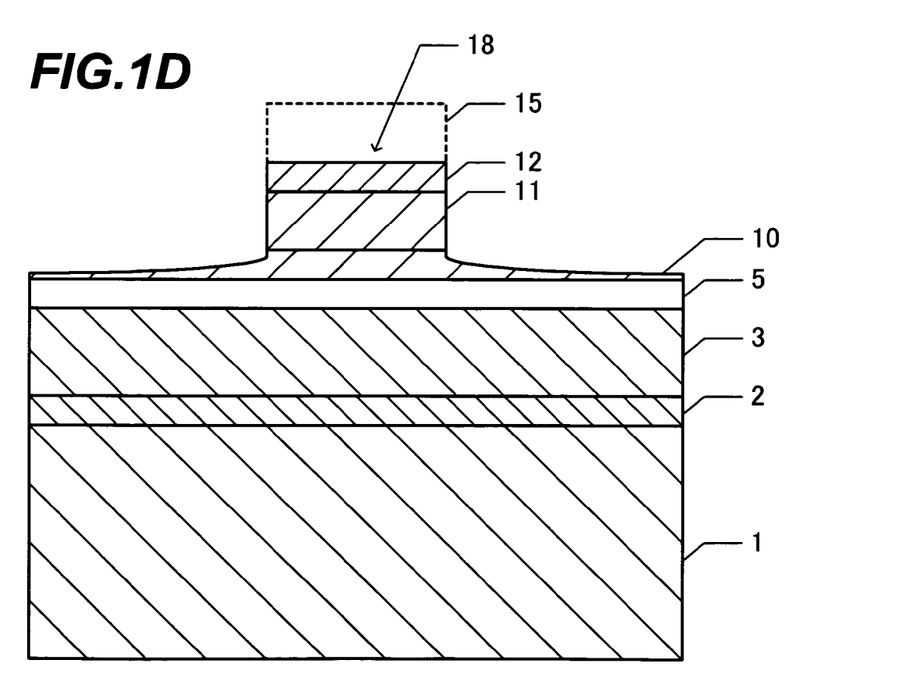

As shown in FIG. 1D, by using the resist pattern 15 as a mask, the n-type contact layer 12 and n-type cladding layer 11 are etched, and the surface layer of the buffer layer 10 is etched. The active layer 5 is not etched. For example, mixture liquid of phosphoric acid, hydrogen peroxide and water is used as etchant. It is also possible to use mixture liquid of sulfuric acid, hydrogen peroxide and water, mixture liquid of bromine, hydrogen bromide and water, mixture liquid of aqueous ammonia, hydrogen peroxide and water, and etc. It is possible to etch the n-type contact layer 12, n-type cladding layer 11 and the surface layer of the buffer layer 10 by dry etching using chlorine-based gas. FIG. 1D is a cross sectional view adopting dry etching.

With this etching, a ridge 18 is formed including the n-type cladding layer 11 and n-type contact layer 12. A skirt portion extends near the sides of the ridge 18. Namely, the buffer layer 10 becomes thinner at a position farther from the n-type cladding layer 11 in a partial area adjacent to the n-type cladding layer 11 as viewed in plan. An apex of the skirt portion is lower than the interface between the n-type cladding layer 11 and buffer layer 10. After etching, the resist pattern 15 is removed.

Figure 1E:
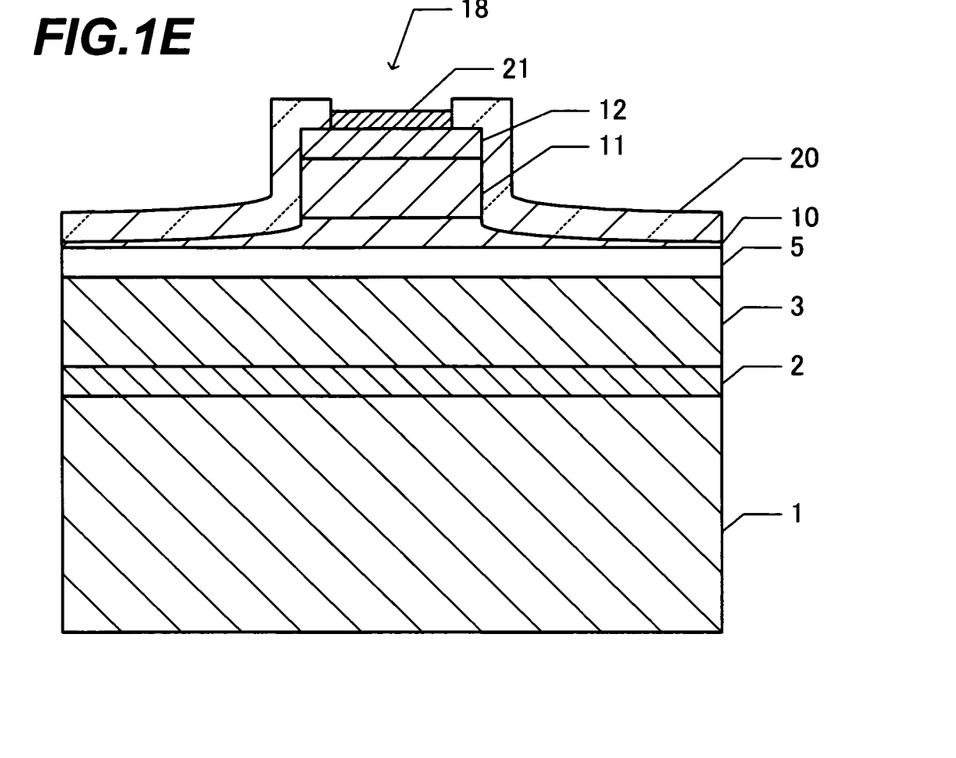

As shown in FIG. 1E, a protective film 20 of silicon oxide is formed covering the surfaces of the buffer layer 10 and ridge 18. For example, the protective film 20 is formed by chemical vapor deposition (CVD). An opening is formed through the protective film 20 to expose a partial upper surface of the ridge 18. An n-side electrode 21 is formed on the n-type contact layer 12 exposed in the opening, the n-side electrode 21 having a two-layer structure of an AuGe layer and an Au layer. For example, the n-side electrode 21 is formed by lift-off method using the resist pattern used as an etching mask for forming the opening through the protective film 20.

Figure 1F:
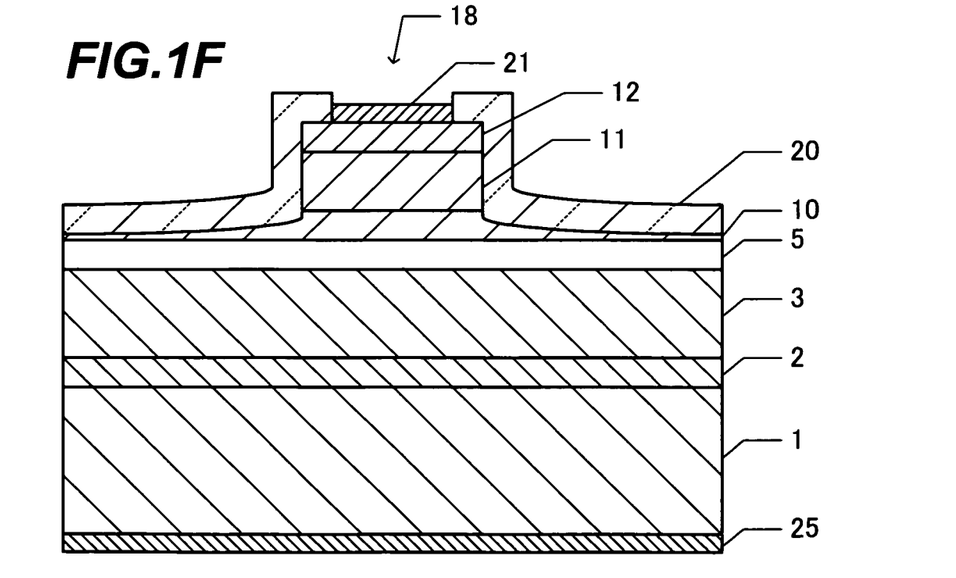
FIG. 1F is a cross sectional view of the optical semiconductor device of the first embodiment.

As shown in FIG. 1F, the bottom of the p-type substrate 1 is polished to thin the substrate to about 100 μm. A p-side electrode 25 having a two-layer structure of an AuZn layer and an Au layer is formed on the bottom of the p-type substrate 1. Thereafter, the p-type substrate 1 is cleaved into chips having a device length of, e.g., 200 μm. High reflection coating is performed on opposite facets of the chip to obtain a reflectivity of about 80%.

In the optical semiconductor device of the first embodiment, as shown in FIG. 1F, the buffer layer 10 is made thinner than the buffer layer just under the n-type cladding layer 11 in regions on both sides of the n-type cladding layer 11, and covers the whole upper surface of the active layer 5. Since the active layer 5 is not etched while the ridge 18 is formed, the active layer 5 is not damaged by etching. Further, the n-type cladding layer 11 is accommodated in the ridge 18 in the width direction of the ridge 18, and does not protrude from both sides of the ridge 18. Therefore, an area where the n-type cladding layer 11 is superposed upon the p-type active layer 5 is about an area of the plan cross section of the ridge 18 at the maximum. An increase in device capacitance can therefore be suppressed.

If the buffer layer 10 is too thin, the apex of the skirt portion becomes lower than the interface between the n-type cladding layer 11 and buffer layer 10, and etching control becomes difficult for the active layer 5 not to be etched. It is therefore preferable to set a thickness of the buffer layer 10 to 50 nm or thicker. Alternatively, it is preferable to set the thickness to 3% or more of a height from the upper surface of the active layer 5 to the apex of the ridge 18. It is not preferable to make too thick the non-doped buffer layer 10 from the viewpoint of an operation speed and device resistance. It is therefore preferable to set a thickness of the buffer layer 10 to 100 nm or thinner.

In the first embodiment, as shown in FIG. 1B, the uppermost layer of the active layer 5 is the non-doped GaAs layer 6c constituting part of the barrier layer 6, and the buffer layer 10 of non-doped GaAs is formed on the uppermost layer. It is therefore impossible to distinguish between the layer 6c and the buffer layer 10. Since the barrier layer 6 is repetitively disposed in the active layer 5, it is possible to specify the lamination structure and thickness of each barrier layer 6. The uppermost barrier layer 6 has the same lamination structure and thickness as those of other barrier layers 6, so that the lamination structure and thickness of the uppermost layer 6 can be specified. In the first embodiment, because a thickness of each barrier layer 6 is 35 nm, the region to a height of 35 nm from the upper surface of the uppermost quantum dot layer 7 can be defined as the barrier layer 6. The non-doped GaAs layer disposed on this region can be defined as the buffer layer 10.

In the first embodiment, the skirt portion is formed lower than the interface between the n-type cladding layer 11 and buffer layer 10. If the side surface of the ridge 18 and the surface of the skirt portion are connected smoothly with each other, the ridge 18 and skirt portion cannot be distinguished clearly in some cases. Also in such cases, it is expected to obtain sufficient device capacitance increase suppressing effects, if a width of the ridge 18 at the interface between the n-type cladding layer 11 and buffer layer 10 is equal to or narrower than 1.5 times the width of the n-type cladding layer 11 at the center thereof in the width direction.

If electrical resistance at the interface between the buffer layer 10 and active layer 5 is high, electrons injected from the n-type cladding layer 11 into the buffer layer 10 are likely to propagate laterally. In order to suppress lateral propagation of electrons, it is preferable to lower the electrical resistance at the interface between the buffer layer 10 and active layer 5. It is therefore preferable to form the buffer layer 10 by using semiconductor having the same composition ratio as that of the upper most barrier layer 6 of the active layer 5.

Next, with reference to FIG. 2, description will be made on an optical semiconductor device according to the second embodiment. Although the buffer layer 10 of the first embodiment is made of non-doped GaAs, in the second embodiment the buffer layer 10 is made of ternary compound semiconductor or compound semiconductor including more than three constituent elements, composition ratio of the buffer layer 10 changing in a thickness direction. The other structures are the same as those of the optical semiconductor device of the first embodiment.

Figure 2:
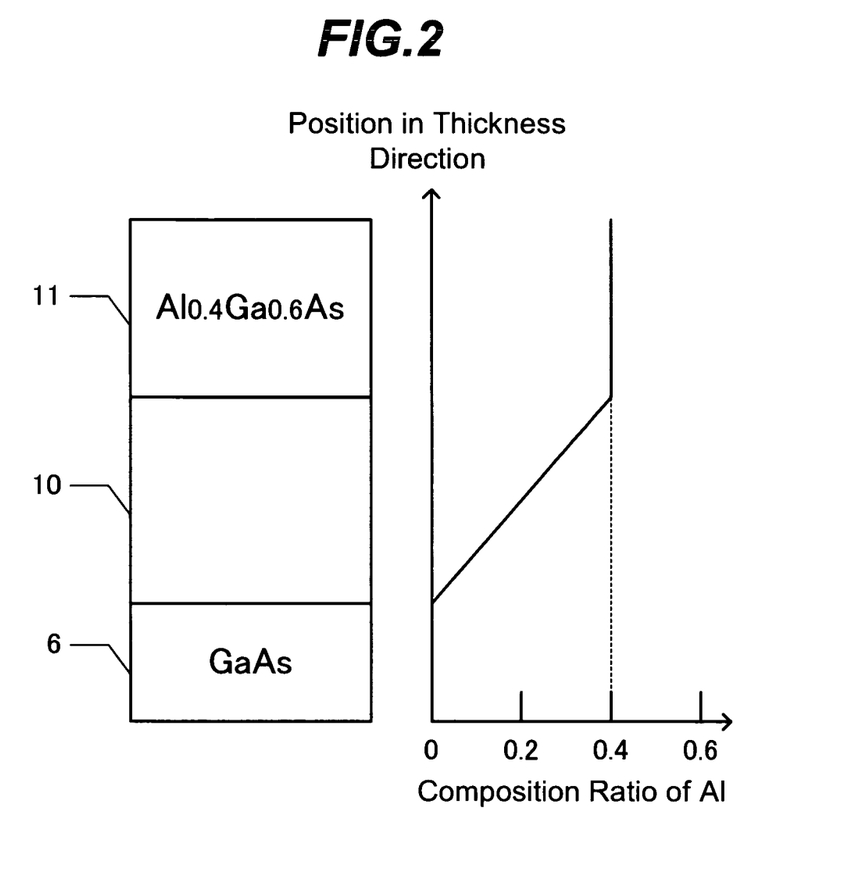
FIG. 2 is a graph showing a distribution of an Al composition ratio in a buffer layer of an optical semiconductor device according to a second embodiment.

FIG. 2 shows the distribution of an Al composition ratio in the buffer layer 10 in a thickness direction. The abscissa of the graph represents an Al composition ratio and the ordinate represents a position in the thickness direction. The buffer layer 10 is sandwiched between the barrier layer 6 of GaAs and an n-type cladding layer 11 of $Al_{0.4}Ga_{0.6}As$. An Al composition ratio of the buffer layer 10 at a position contacting the barrier layer 6 is 0, and that at a position contacting the n-type cladding layer 11 is 0.4. In the buffer layer 10, the Al composition ratio changes continuously and monotonously. Namely, a band gap of the buffer layer 10 at the position contacting the barrier layer 6 is equal to a band gap of the barrier layer 6. A band gap of the buffer layer 10 at the position contacting the n-type cladding layer 11 is equal to a band gap of the n-type cladding layer 11. It is therefore possible to prevent an increase in electrical resistance to be caused by a hetero interface.

In order to change the composition ratio of the buffer layer 10 in the depth direction, a temperature of source material cell is changed during film forming by MBE.

In the second embodiment, the Al composition ratio changes continuously in the buffer layer 10. Instead, thin films whose composition ratios change little by little may be stacked. In this case, the Al composition ratio changes stepwise.

As seen from FIG. 1F, even if electrical resistance is high at an interface between the buffer layer 10 and n-type cladding layer 11, electrons do not propagate laterally. In order to suppress lateral propagation of electrons, it is preferable to set a composition ratio (band gap) particularly of a part, being in contact with the active layer 5, of the buffer layer 10 equal to a composition ratio (band gap) of the barrier layer 6 constituting part of the active layer 5.

In the second embodiment, the band gaps at the interface between the barrier layer 6 and buffer layer 10 and at the interface between the buffer layer 10 and n-type cladding layer 11 do not change discontinuously. Even if the band gaps change discontinuously at these interfaces, the same advantageous effects as those of the second embodiment can be expected if the change is small. The band gap of the barrier layer 6 is smaller than that of the n-type cladding layer 11. A hetero barrier at the interfaces can be made low by making the band gap of the buffer layer 10 wider than that of the barrier layer 5 and making it narrower than that of the n-type cladding layer 11. The hetero barrier at the interfaces can be lowered further by changing the composition ratio in the thickness direction in a manner that the band gap of the buffer layer 10 becomes large as a position approaches from the barrier layer 6 to the n-type cladding layer 11.

Figure 3:
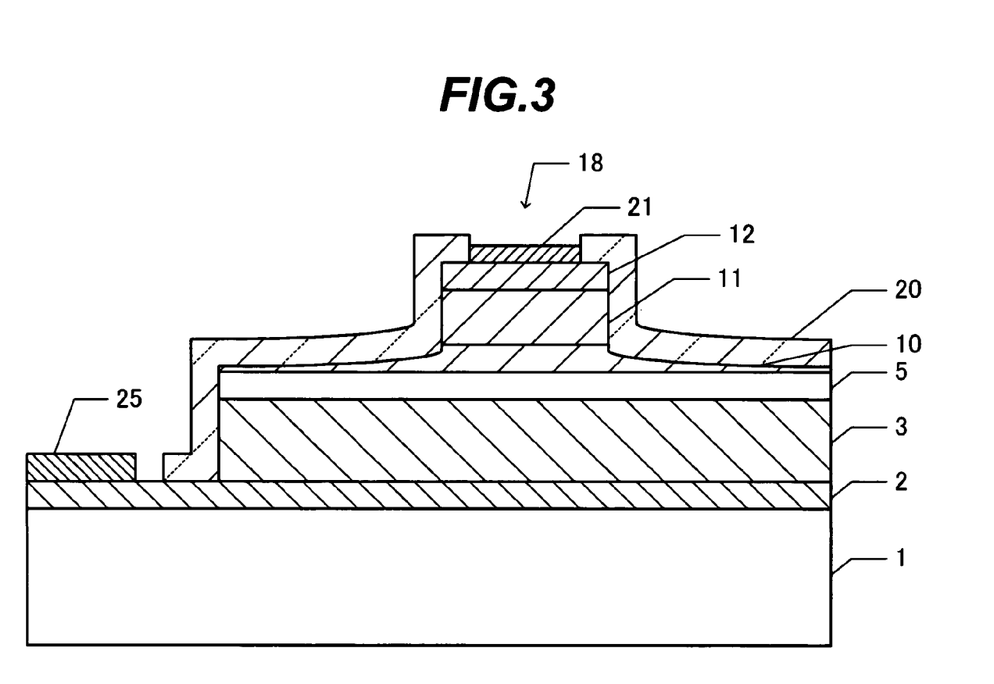
FIG. 3 is a cross sectional view of an optical semiconductor device according to a third embodiment.

FIG. 3 is a cross sectional view showing an optical semiconductor device according to the third embodiment. Although the p-type substrate is used in the first and second embodiments, a high resistance substrate is used in the third embodiment. A p-side electrode cannot be therefore formed on the bottom of the substrate 1.

In the third embodiment, portions of the active layer 5 and p-type cladding layer 3 are etched to expose a partial surface of the p-type buffer layer 2, and a p-side electrode 25 is formed on this exposed surface. In this case, different from forming the electrode on the bottom of the substrate 1, it is preferable from the viewpoint of lowering electrical resistance that a dopant concentration of the p-type buffer layer 2 is made as high as possible. The other structures are the same as those of the optical semiconductor device of the first or second embodiment. Also in the third embodiment, the same advantageous effects as those of the first and second embodiments can be obtained.

The structure of the active layer adopted in the first to third embodiments, such as a density of quantum dots, an optical emission wavelength, the number of quantum dot layers, a structure of the strain relaxing layer and a lamination structure of the barrier layer, may be changed properly according to the desired device characteristics. A layer for controlling a waveguide mode may be inserted between the p-type cladding layer 3 and active layer 5.

The active layer 5 may have a more complicated structure. For example, the barrier layer 6 may be constituted of two types of layers having different band gaps. For example, the barrier layer 6 may be constituted of a p-type InGaAs layer and a non-doped GaAs layer.

In the above-described embodiments, although the barrier layer 6 constituting part of the active layer 5 is made of GaAs, the barrier layer 6 may be made of AlGaAs at a composition ratio having a band gap narrower than that of the p-type cladding layer 3 and n-type cladding layer 11. In this case, the buffer layer 10 is made of AlGaAs having the same composition ratio as that of the barrier layer 6. The composition ratio may be changed in the thickness direction as in the case of the second embodiment.

In the above-described embodiments, although the InAs quantum dot layer is formed over the GaAs substrate, the substrate material and quantum dot material may be a combination of other compound semiconductor materials. For example, quantum dots disposed over the GaAs substrate may be made of InAs doped with Sb or N, or compound semiconductor such as GaSb and InGaSb. InAs quantum dots or InAsSb quantum dots may be formed over an InP substrate. Quantum dots may be formed over an AlGaInAs layer or an InGaAsP layer. After quantum dots are formed over a tentative substrate of InP or the like, this substrate may be adhered to a substrate of other material such as GaAs.

The substrate 1, p-type cladding layer 3, active layer 5, buffer layer 10 and n-type cladding layer 11 may be made of compound semiconductor other than the materials illustratively used in the above-described embodiments. Materials are selected in a way that a refractive index of the cladding layers 3 and 11 is smaller than an effective refractive index of the active layer 5.

In the above-described embodiments, although a Fabry-Perot type laser diode is used as an example of an optical semiconductor device, the buffer layer 10 of the embodiments is also applicable to a distributed feedback (DFB) type laser diode and a distributed Bragg reflector (DBR) type laser diode. The optical semiconductor device of the embodiment is also applicable to a semiconductor optical amplifier (SOA) having antireflection-coated opposite facets, a semiconductor optical gate switch and an optical-integrated device integrating these components.

In the above-described embodiments, although the active layer has the lamination structure of quantum dot layers and p-type barrier layers, it may be p-type quantum well layers or strain quantum well layers, or a lamination structure having quantum well layers or strain quantum well layers, and p-type barrier layers.

The present invention has been described in connection with the preferred embodiments. The invention is not limited only to the above embodiments. It will be apparent to those skilled in the art that other various modifications, improvements, combinations, and the like can be made.

What are claimed are:

1. An optical semiconductor device comprising:
   a p-type cladding layer of p-type semiconductor formed over a substrate;
   an active layer including a p-type semiconductor region, not including an n-type semiconductor region and disposed over the p-type cladding layer;
   a buffer layer of non-doped semiconductor disposed on and being in contact with the active layer;
   a ridge-shaped n-type cladding layer of n-type semiconductor disposed on and being in contact with a partial surface of the buffer layer,
   wherein the buffer layer on both sides of the ridge-shaped n-type cladding layer is thinner than the buffer layer just under the ridge-shaped n-type cladding layer,
   wherein the buffer layer includes a region, a thickness of which decreases with increasing distance from the ridge-shaped n-type cladding layer, and wherein the active layer has a lamination structure having barrier layers each including a p-type semiconductor layer and quantum dot layers each including quantum dots distributing in-plane, the barrier layers and the quantum dot layers being alternately stacked.

2. The optical semiconductor device according to claim 1, wherein the buffer layer covers a whole upper surface of the active layer.

3. The optical semiconductor device according to claim 1, wherein a width of the ridge-shaped n-type cladding layer at an interface between the ridge-shaped n-type cladding layer and the buffer layer is equal to or narrower than 1.5 times a width of the ridge-shaped n-type cladding layer at a center in a thickness direction.

4. The optical semiconductor device according to claim 1, wherein a thickness of the buffer layer is 50 nm or thicker.

5. The optical semiconductor device according to claim 1, wherein the buffer layer is made of semiconductor material having a same composition ratio as a composition ratio of semiconductor material of the active layer at a position being in contact with the buffer layer.

6. The optical semiconductor device according to claim 1, wherein a composition ratio of the buffer layer changes in a thickness direction in a way that a band gap becomes large as a position approaches from the active layer to the ridge-shaped n-type cladding layer.

7. The optical semiconductor device according to claim 1, wherein a composition ratio of the buffer layer changes in a thickness direction in a way that a band gap becomes large as a position approaches from the active region to the ridge-shaped n-type cladding layer and that the composition ratio of the buffer layer at a position being in contact with the active layer is equal to a composition ratio of the active layer at a position being in contact with the buffer layer.

8. The optical semiconductor device according to claim 6, wherein a band gap of the buffer layer at a position being in contact with the ridge-shaped n-type cladding layer is equal to a band gap of the ridge-shaped n-type cladding layer.

9. The optical semiconductor device according to claim 1, wherein the buffer layer is made of GaAs or AlGaAs, and the ridge-shaped n-type cladding layer is made of AlGaAs.

* * * * *